United States Patent [19]
Robson et al.

[11] Patent Number: 6,105,518
[45] Date of Patent: *Aug. 22, 2000

[54] DURABLE PLASMA TREATMENT APPARATUS AND METHOD

[75] Inventors: Anthony E. Robson, Alexandria, Va.; Ronald A. Rudder, Wake Forest; Robert C. Hendry, Hillsborough, both of N.C.; Moses M. David; James V. Burt, both of Woodbury, Minn.

[73] Assignee: Research Triangle Institute, Research Triangle Park, N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/885,720

[22] Filed: Jun. 30, 1997

Related U.S. Application Data

[62] Division of application No. 08/483,982, Jun. 7, 1995, Pat. No. 5,874,014.

[51] Int. Cl.[7] .................................................. H05H 1/00
[52] U.S. Cl. ........................... 110/346; 156/345; 216/67; 216/68; 216/71; 118/723 E; 118/723 I; 118/723 R; 427/535; 427/569; 313/310; 313/311; 313/336; 588/227; 134/1.1
[58] Field of Search ............................ 428/408; 423/446; 156/345; 216/67, 68, 71; 118/723 E, 723 R, 723 I; 427/535, 569; 313/310, 311, 336; 588/227; 134/1.1; 110/346

[56] References Cited

U.S. PATENT DOCUMENTS

| | | |
|---|---|---|
| 4,486,461 | 12/1984 | Ito et al. . |
| 4,593,644 | 6/1986 | Hanak . |
| 4,661,834 | 4/1987 | Varteresian et al. . |
| 4,686,113 | 8/1987 | Delfino et al. . |
| 4,735,633 | 4/1988 | Chiu ................................................ 55/2 |
| 4,786,352 | 11/1988 | Benzing . |
| 4,870,030 | 9/1989 | Markunas et al. ........................ 437/81 |
| 4,900,628 | 2/1990 | Ikegaya et al. .......................... 428/408 |
| 4,960,643 | 10/1990 | Lemelson ................................ 428/408 |
| 4,990,403 | 2/1991 | Ito . |
| 5,026,484 | 6/1991 | Juvan . |
| 5,028,452 | 7/1991 | Beatty . |
| 5,134,946 | 8/1992 | Poovey . |
| 5,199,918 | 4/1993 | Kumar . |
| 5,204,145 | 4/1993 | Gasworth . |
| 5,234,529 | 8/1993 | Johnson . |
| 5,256,854 | 10/1993 | Bromberg et al. . |
| 5,275,798 | 1/1994 | Aida . |
| 5,288,969 | 2/1994 | Wong et al. . |
| 5,779,991 | 7/1998 | Jenkins . |
| 5,798,496 | 8/1998 | Eckhoff et al. . |
| 5,877,471 | 3/1999 | Huhn et al. . |

OTHER PUBLICATIONS

The Instiitution of Electrical Engineers, pp. 47–55, Apr. 1959, A.E. Robson et al., "Choice of Materials and Problems of Design of Heavy–Crrent Toroidal Discharge Tubes".

*Primary Examiner*—Archene Turner
*Attorney, Agent, or Firm*—Oblon, Spivak, McClelland, Maier & Neustadt, P.C.

[57] ABSTRACT

A method and apparatus for treating a work surface, wherein there is provided a chamber having a longitudinal axis and longitudinally extending electrically conductive sidewalls, at least one sidewall having at least one longitudinally extending gap that interrupts a current path through the sidewalls transverse to the longitudinal axis, and wherein the chamber is sealed to allow pressure inside the chamber to be controlled. Also provided is an axially-extending array of current-carrying conductors which at least partially encircle the chamber, are transverse to the longitudinal axis, and establish a magnetic field parallel to the longitudinal axis of the chamber, and a power supply connected to the conductor array and adapted to provide high-frequency current in the conductors to magnetically induce ionization of the gaseous material in the chamber and form a plasma sheath that surrounds and extends along the longitudinal axis and conforms to the sidewalls of the chamber, and wherein the work surface is exposed to the plasma sheath and extends in the direction of the longitudinal axis.

17 Claims, 10 Drawing Sheets

DURABLE PLASMA TREATMENT APPARATUS AND METHOD

This is a Division of application Ser. No. 08/483,982, filed on Jun. 7, 1995, now U.S. Pat. No. 5,874,014.

This invention was made with Government support under Agreement No. MDA972-94-3-0041 awarded by ARPA. The Government has certain rights in the invention.

FIELD OF THE INVENTION

The instant invention relates to apparatus and methods for generating intense plasmas useful in chemical vapor deposition, etching and other operations. In one important embodiment, the invention relates to a vapor deposition system in which a plasma is used to deposit large-area diamond films.

BACKGROUND OF THE INVENTION

Prior art chemical vapor deposition (CVD) processes for the production of diamond films include DC torch, microwave, hot filament and rf plasma techniques. Generally, the prior art techniques deposit diamond over a rather small area and/or at slow deposition rates, with the result that film costs have been high.

A recent patent application (U.S. Ser. No. 08/361,667, filed Dec. 22, 1994) teaches a novel method and apparatus for the generation of a large-area high-frequency induction plasma and for the presentation to that plasma of a large-area work surface onto which diamond can be deposited in large areas and at reasonably fast rates. The diamond is deposited in a chamber which is encircled by high frequency current on paths that are substantially transverse to, and arrayed along, the axis of the chamber. A plasma sheath generated within the chamber surrounds and extends along the axis of the chamber and conforms to the sidewalls of the chamber. A work surface also extends along the axis of the chamber and is exposed to the plasma sheath, preferably at the outer boundary of the plasma sheath along the chamber sidewalls.

In a specific method and apparatus disclosed in the recent patent application, the chamber comprises dielectric walls (for example, made from quartz) to allow penetration of magnetic and electric fields into the chamber. The present invention extends the benefits realized from the earlier invention by providing a chamber structure (for example, made from metal) that is highly durable, even at elevated temperatures developed during operation of the system at a high power level.

SUMMARY OF THE INVENTION

In brief summary, apparatus of the invention generally comprises:

a chamber having a longitudinal axis and longitudinally extending electrically conductive sidewalls, e.g., made from a metal such as copper or aluminum; at least one sidewall has at least one longitudinally extending gap that interrupts a current path through the sidewalls transverse to the longitudinal axis;

enclosure means sealing the chamber to allow pressure inside the chamber to be controlled, means for providing a gas in the chamber;

an axially extending array of current-carrying conductor paths that at least partially encircle the chamber, are transverse to the longitudinal axis, and establish a magnetic field within the chamber parallel to the longitudinal axis of the chamber;

a power supply connected to the conductor array and adapted to provide high frequency current in the conductor paths to magnetically induce ionization of the gaseous material in the chamber and form a plasma sheath that surrounds and extends along the longitudinal axis and conforms to the sidewalls of the chamber; and a work surface that extends in the direction of the longitudinal axis.

Preferably, for operations in which a high temperature is desired in the plasma chamber, the work surface is contacted by means for conducting heat away from the work surface; e.g., a thermally conductive layer is disposed between the work surface and the chamber sidewalls, which are generally metal; and hollow conduits are formed in the sidewalls for circulation of a gaseous or liquid coolant.

In preferred chambers, the sidewalls have a plurality of longitudinally extending gaps, so that portions or all of the sidewalls in effect comprise closely spaced highly conductive metal bars that extend along the longitudinal axis over at least a substantial part of the length of the chamber. Such a multi-gap structure minimizes the magnitude of the voltage developed across individual gaps, thereby minimizing any tendency for arcing across the gaps.

The chamber preferably has at least one large-area planar sidewall, and the plasma sheath extends over the sidewall, parallel to the sidewall.

The current-carrying conductor paths preferably are electrically connected in parallel to minimize impedance in the circuit, thereby maximizing the applied current in the conductors, and in turn maximizing the magnetic field in the chamber. To further achieve low impedance, at least part of the individual conductor paths are generally comprised of wide conductive straps or large-diameter high-conductivity rods, which preferably are tubular to allow cooling of the conductors.

In using the described apparatus, the work surface is exposed to the plasma sheath, preferably at the outer boundary of the plasma sheath adjacent and generally parallel to the chamber sidewall. To prepare diamond film, the gaseous material introduced into the chamber comprises diamond-precursor ingredients such as a mixture of vapors of water and alcohol or hydrogen and methane. Diamond film is deposited in the reactor at high volumetric production rates per unit of power input.

DETAILED DESCRIPTION OF THE INVENTION

Figure 1:
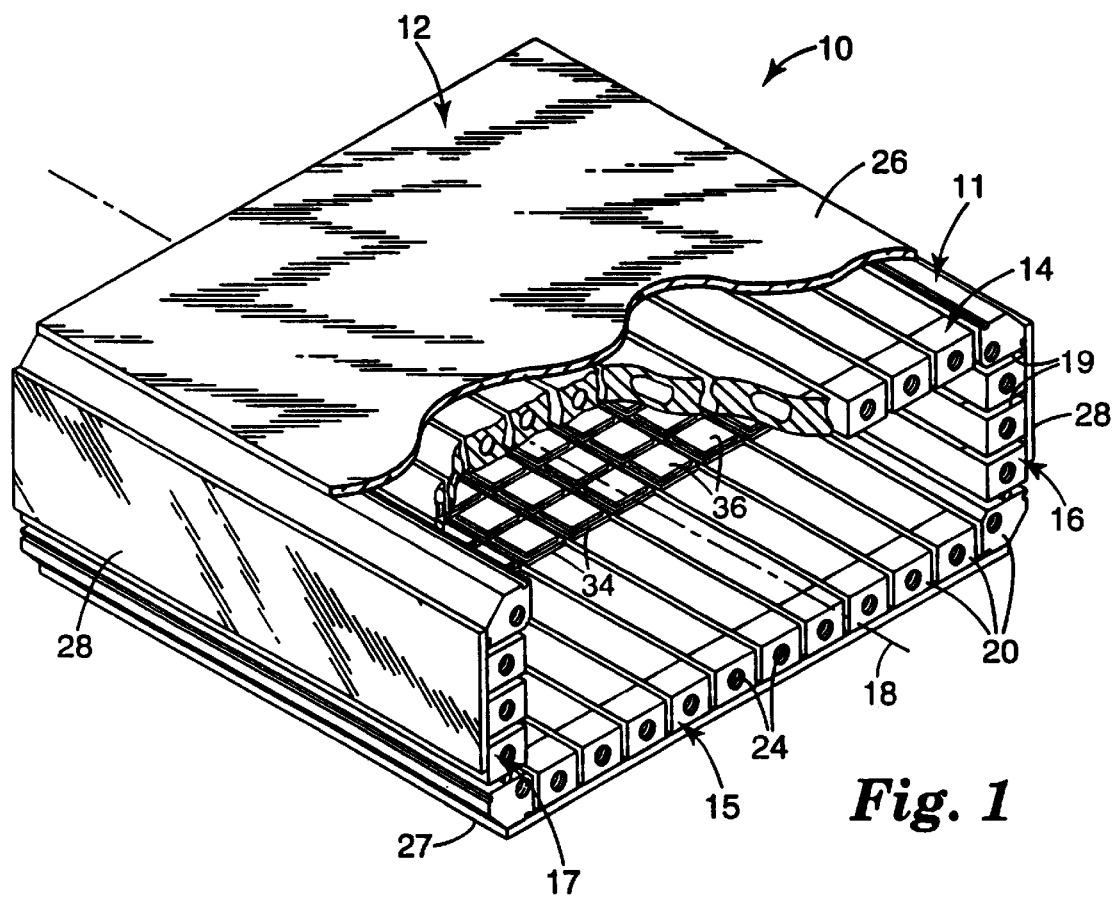
FIG. 1 is a perspective view, with parts broken away, of an enclosure and chamber useful in the present invention.

FIGS. 1–5 show an illustrative enclosure 10 for use in the present invention. The enclosure 10 comprises a chamber 11 and enclosure means 12 for sealing the chamber. The chamber 11 comprises upper and lower sidewalls 14 and 15 and shorter vertical sidewalls 16 and 17 connecting the upper and lower sidewalls. A longitudinal axis 18 extends through the chamber parallel to the desired direction of the applied magnetic field in the chamber.

The sidewalls 14–17 of the chamber 11 comprise individual closely spaced bars 20 assembled and held together, for example, by insertion into sockets 21 in chamber end plates 22 and 23 (see FIGS. 2 and 4) and by brazing of the bars to the socket walls. The bars 20 are preferably planar on at least their inner sidewall, and preferably are rectangular in cross-section, so as to establish a more continuous and planar inner sidewall surface and allow close spacing between the bars. Gaps or slots 19 lie between the bars. Advantageously, cylindrical bores 24 are formed in the bars, and a liquid coolant, generally water, can be passed through the bores 24 to cool the bars.

The illustrated chamber is formed as two chamber halves (a base plate and a rectangular domed structure resting on the base plate) which can be conveniently separated for access to the interior of the chamber. The end plates 22 and 23 are divided in two, having lower portions 22a and 23a and upper portions 22b and 23b (see FIGS. 2 and 4). The bars 20 forming the lower sidewall 15 engage in sockets 21 of lower portions 22a and 23a, and together, the bars 20 of the lower sidewall 15 and the end plates 22a and 23a form a lower base plate for the chamber. The remaining bars, comprising the domed top half of the chamber, engage in sockets 21 of upper portions 22b and 23b. The assembled base plate is grooved around its outer perimeter to receive an O-ring 25 against which the lower edge of the domed top half of the chamber is pressed and held by a fixture (not shown).

Instead of being formed from individual bars, the sidewalls of the chamber can comprise plates formed or cut with a plurality of gaps or slots extending over a substantial portion of the length of the plates so as to in effect subdivide the plates into a plurality of bars or bar-like elements, which extend in the direction of the longitudinal axis 18.

The bars 20 should comprise a conductive metal and also be mechanically strong. The preferred metal is copper, but silver, aluminum or brass could also be used. Almost any mechanically durable and formable material could be used, including carbon steel and stainless steel, especially if they are silver-or copper-plated to provide high conductivity around their circumference.

The enclosure means 12 of the illustrative enclosure 10 comprises dielectric plate 26 on the top of the chamber, dielectric plate 27 on the bottom of the chamber, and dielectric plates 28 on each of the two vertical sides of the chamber. The previously mentioned chamber endplates 22 and 23 also have an enclosing function. Holes 29 are formed in the end plates to allow introduction of a coolant to the bores 24. A dielectric material such as quartz or tempered glass can be used for the sideplates 26–28 to allow penetration of a magnetic field into the chamber. The endplates can also be dielectric, but typically are metal to allow convenient machining of the sockets 21 and holes 29, and to better achieve mechanically strong attachment to the bars inserted into the sockets 21.

Figure 2:
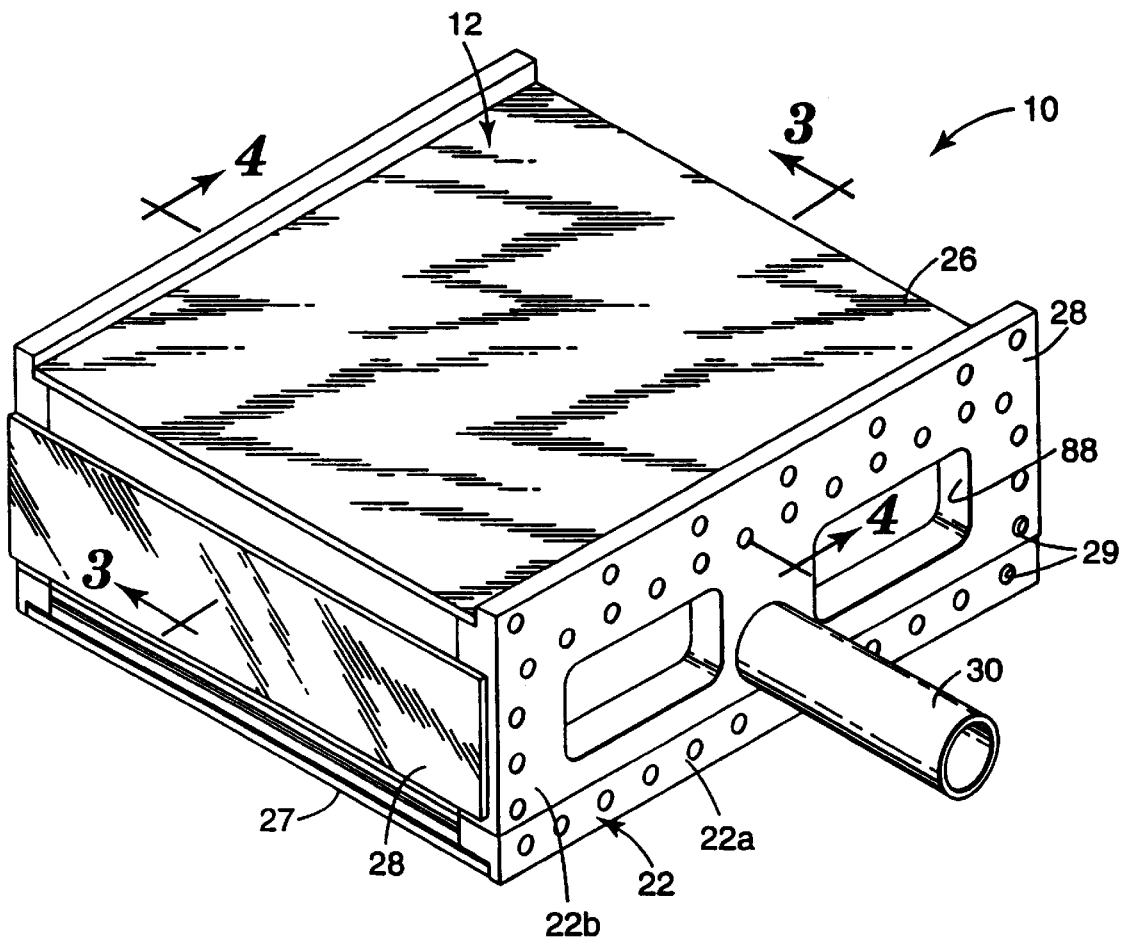
FIG. 2 is an overall perspective view of the enclosure in FIG. 1.
Figure 4:
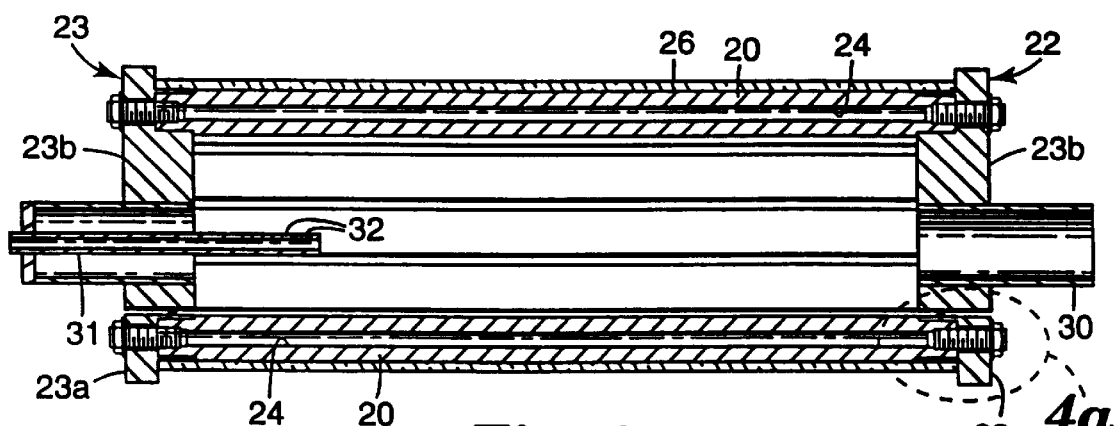
FIG. 4 is a sectional view along the lines 4—4 of FIG. 2.
Figure 4A:
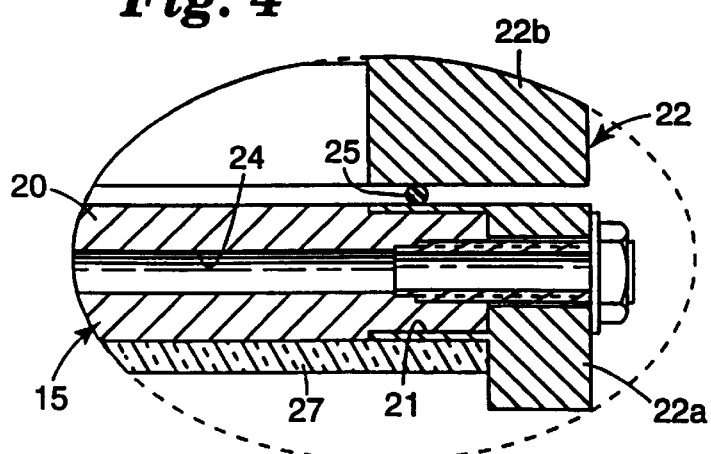

Structure for introduction and evacuation of gas is also included in the endplates in the illustrated chamber 11. As shown in FIGS. 2 and 4, a tube 30 is fused to the endplate 22 and serves as an outlet port; and a tube 31 is mounted in the endplate 23 to serve as an inlet port. Tube 31 extends toward the center of the chamber 11, and in this illustrative case, as shown in FIG. 4, circular openings 32 near the end of the inlet tube 31 assist gas to be distributed more uniformly in the chamber and thereby contribute to a more uniform treatment or deposit on a work surface in the chamber. Alternatively to the illustrated arrangement, outlet tube 30 and inlet tube 31 may be coaxially mounted in the same endplate. Also, gas can be introduced and/or evacuated through a plurality of ports arranged to increase uniformity of gas distribution in the chamber. Gas can be introduced through ports in the side plates as well as or instead of in the end plates. Although the gaseous material acted on by the plasma generally enters the chamber as a gas, a solid or liquid that sublimes or vaporizes once it is in the chamber may also be used. The tubes can be water-cooled when they extend into the central plasma region to protect them from the high heat flux produced by an intense plasma.

Chambers used in the invention may have a variety of shapes, but preferably have at least one extensive substantially planar surface which serves as a work surface or supports a work surface. In the chamber 11, the upper and lower sidewalls provide planar work or work-support surfaces, as do, to a lesser extent, the vertical sidewalls. The planar surface is interrupted by the gaps or slots, and could be configured, e.g., with a network of ridges on the interior surface of the bars. Such configured or interrupted surfaces are regarded as planar herein, since the length and width of the surfaces are far greater than any thickness or height dimension. The larger the planar surface, the larger the area of a planar film that can be deposited or the larger the planar surface that can be treated. The planar surface is preferably at least 100 cm$^2$ in area and more preferably 500 or 1000 cm$^2$ or larger, e.g., 1 or 2 m$^2$ in area or larger. Surfaces being treated or on which a deposit is being made need not be parallel to the longitudinal axis, as when, for example, diamond is deposited on an array of cutting tools.

A chamber that is rectangular, as in the case of chamber 11, is preferred for some applications, because a large-area planar film can be deposited on both the large-area sidewalls 14 and 15 of the chamber. Deposits also occur on the shorter sidewalls 16 and 17, but less effectively as will be subsequently discussed. "Sidewalls" refers to walls that extend in the direction of the longitudinal axis (though they may at the same time extend toward the longitudinal axis, as in the case of slanted end-portions used for some chambers). The sidewalls surround the longitudinal axis in that they form at least part of the lateral portions of the chamber through which the longitudinal axis extends; typically the sidewalls are parallel to and spaced from the longitudinal axis, though in some constructions, e.g., in the case of slanting end-portions, they may intersect the longitudinal axis at some point.

The size of an enclosure or chamber useful in the invention is limited only by the mechanical integrity necessary to withstand the atmospheric pressure applied to the outside of the enclosure or chamber and a need for the chamber to be substantially shorter than the characteristic wavelength at the operating frequency. At 10 Mhz, the characteristic wave length is about 30 meters. The aspect ratio, i.e., the ratio of the width to the height of the chamber preferably is at least about 2:1, more preferably at least about 5:1, most preferably about 10:1 or larger.

The enclosure is preferably capable of maintaining an internal pressure of less than about 100 Torr, more preferably less than about 10 Torr, most preferably about one Torr or less. Means for controlling the pressure in the enclosure, not shown, can include, for example, butterfly control valves, mass flow controllers, and vacuum pumps, and a pressure measuring device, such as a capacitance manometer, all of which is well known to those skilled in the art.

A water jacket or other cooling means, not shown, may be included, around the exterior of the enclosure, for example to cool dielectric plates that enclose or seal the chamber.

Figure 5:
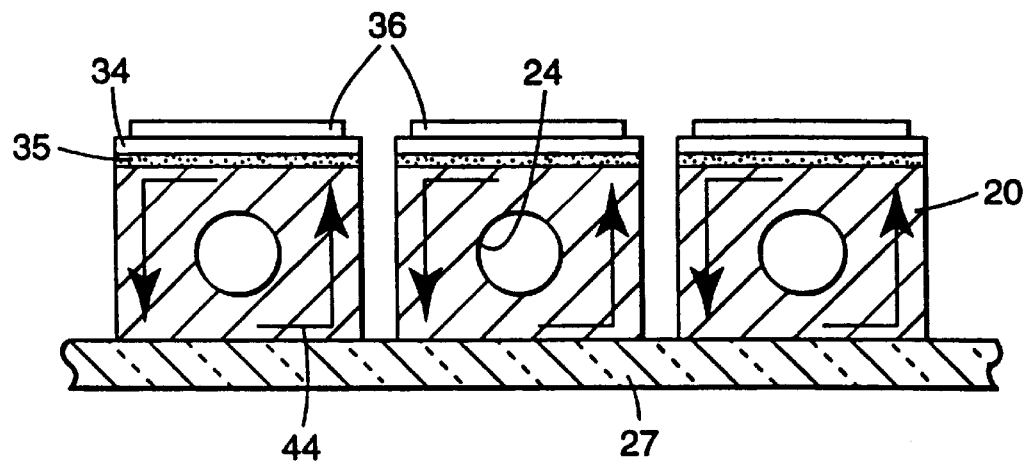
FIG. 5 is an enlarged sectional view of one part of the enclosure of FIGS. 1–4.

FIG. 5 is an enlarged view of part of the sidewall 15 of the chamber 11, including one illustrative work surface arrangement in the chamber. Because liquid coolant cools the sidewalls, it is preferred in many uses of apparatus of the invention to separate the work surface from the cooled sidewall, and such means are illustrated in FIG. 5. In this illustrative case, individual quartz plates 34 are adhered to the inner surface of individual bars 20 by an adhesive tape 35. A work surface such as a silicon wafer 36 is disposed on the plate 34. The wafer 36 faces the plasma; and the work surface on the wafer is desirably quite hot, e.g. 800° C. or more for diamond deposition (temperatures ranging between 700 and 900° C., most preferably 800–850° C., are considered optimum for diamond deposition). The wafer body and quartz plate in part insulate the work surface of the wafer from the bar, which may be at a temperature of 50° C., for example. To maintain the work surface of the wafer or other work surface structure at a desired temperature, it may be desired to conduct some heat from the work surface to the bar, and this has been done effectively with an adhesive tape 35 that is thermally conductive. Although the plate 34 is shown as having a width coextensive with the width of the electrically conductive bar 20, in fact, the plate can extend over two or more of the bars and thereby cover the gaps or slots 19. Similarly the wafer can be wider than the width of the bar 20. In fact, a quartz plate or wafer can cover the whole extent of the sidewall provided it does not, through contact, provide an electrical connection between any two bars.

Figure 6:
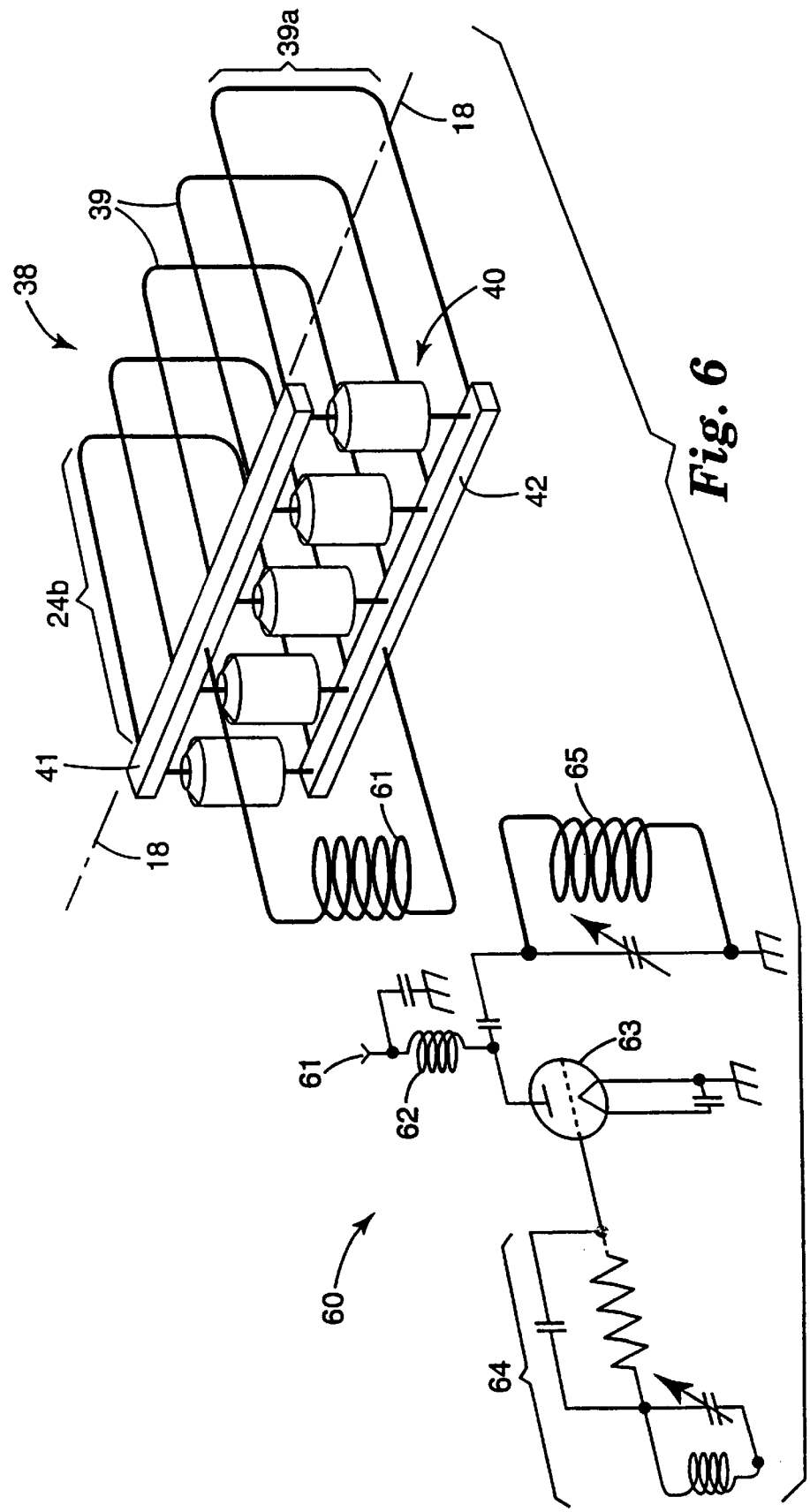
FIG. 6 is a perspective view of an axially extending array of current-carrying conductors, together with a diagram of a power supply useful in the invention.

FIG. 6 shows an illustrative power applicator 38, or antenna, which generally encircles or surrounds an enclosure such as the enclosure 10 and applies plasma-generating power to the gaseous contents of the chamber 11. The applicator comprises current-carrying conductors 39, resonated by a capacitor bank comprising capacitors 40. There may or may not be one capacitor for each conductor 39, depending on the total capacitance needed and the power level to be applied. In combination, an individual conductor 39 and the capacitor bank to which it is connected form a conductor loop, and the individual conductor loops are electrically connected in parallel through bus bars 41 and 42. The applicator 38 is shown separately from a chamber for convenience, but the chamber generally lies within the conductor loops, with the longitudinal axis of the chamber substantially perpendicular to the plane of the individual conductor loops.

The "U"—shape for conductors 39 is desirable for enclosing chambers that are more wide than high, as useful for large-area planar depositions. The conductors are desirably of a large diameter so as to minimize impedance. To carry out the invention, current flow is induced in the plasma gas, producing heating, ionization, and dissociation of the gas. The magnitude of the current flow in the plasma gas is proportional to the current flow in the current-carrying conductors. For any current-carrying conductor, there is an impedance to alternating current flow which increases with the resistance of the chosen conductor and which increases with $\omega L$, where $\omega$ is equal to $2\pi f$ and "f" is the operating frequency, and L is the inductance. To maximize current flow for any given applied voltage level requires that high conductivity materials be chosen and that the inductance of the current-carrying conductors be kept low. Such a condition is achieved in the apparatus shown in FIG. 6 where large-diameter conductors are used, and the conductors are arranged as individual loops electrically connected in parallel and arrayed along the longitudinal axis of the chamber.

The conductors are preferably formed from high conductivity metals (e.g., silver, copper, aluminum, or brass) to reduce power loss. As a practical matter, copper or silver-plated copper is generally used, but silver-plated brass or aluminum can also be used. Conductors in a tubular form, i.e., with an internal conduit, are desirable to allow cooling fluid to circulate within the conductors. Tubes having a diameter as small as about 0.5 to 1 cm are useful for low-power applications, and as large as about 2.5 cm (one inch) or higher for high-power applications.

A bus bar, not shown, may be connected across the midpoint of the array along the length 39a of the conductors 39 and connected to ground, thereby establishing a symmetrical voltage about a ground reference, should this be desired. A ground connection may be provided to reference any part of the applicator to ground as well known in the art to achieve either symmetrical or asymmetrical voltages about a ground reference.

Figure 10A:
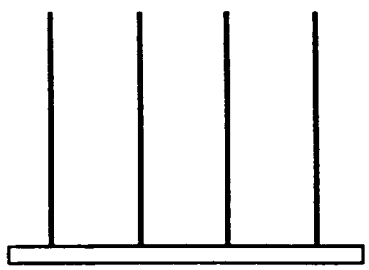
FIG. 10 is a schematic plan view of other arrays of current-carrying conductors.
Figure 10B:
Figure 10C:
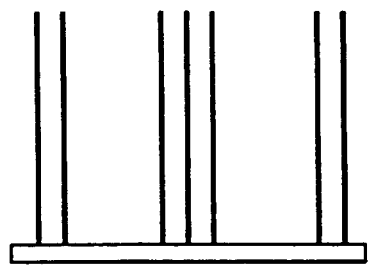
Figure 10D:
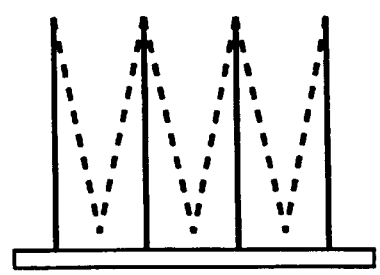
Figure 10E:
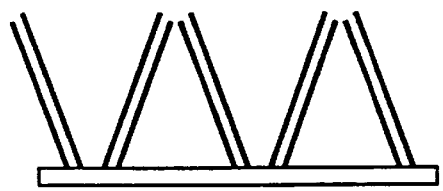
Figure 10F:
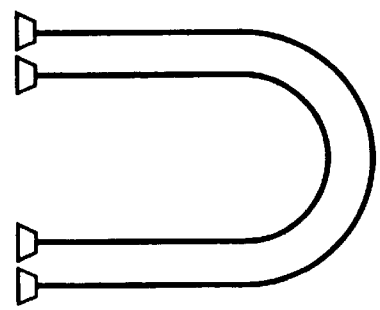

The conductor loops are transverse to the longitudinal axis of the chamber. In FIG. 6, the planes of the conductor loops are perpendicular to the longitudinal axis and evenly spaced. In other configurations the conductors can be spaced irregularly as shown in FIGS. 10(b) and (c), e.g., to achieve desired plasma configurations and intensities. Chevron configurations as shown in FIG. 10(e) or combinations of parallel and chevron configurations as shown in FIG. 10(d), can be used. Also multiple current-carrying conductors, with one conductor loop overlying or surrounding another as shown in FIG. 10(f), may be used.

Series-wound coils such as helical coils, preferably wound as a rectangular or square helix. may also be used. The higher inductance of such series-wound coils may limit the current flow in current-carrying conductors and thereby restrict the maximum value of transferred power; but otherwise such coils would be useful at power levels below the maximum.

Figure 7:
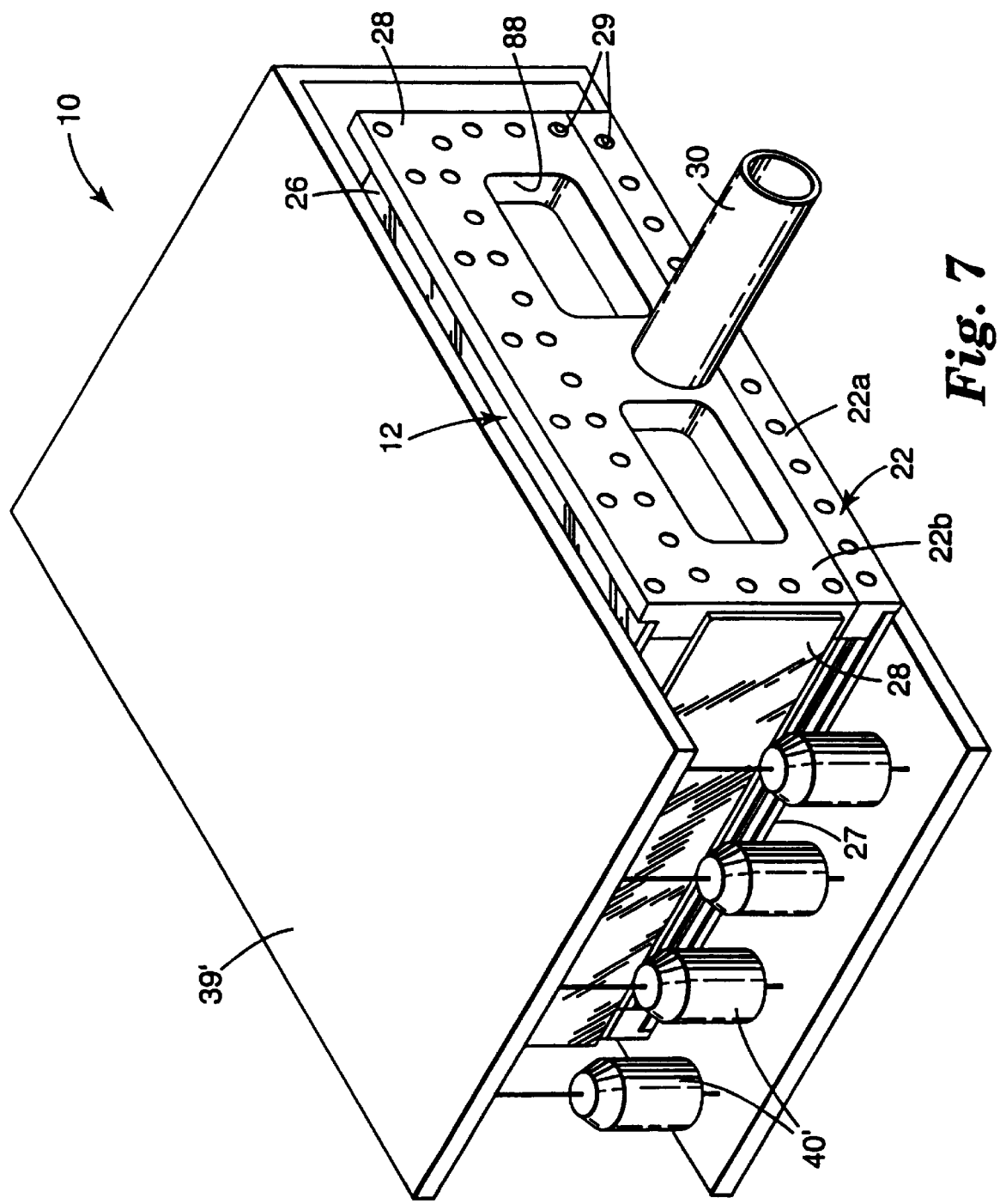
FIG. 7 is a perspective view, partially in section, showing another form of axially extending array of current-carrying conductor paths, i.e., a conductor strap, disposed in place, encircling a chamber.

Solid elements such as low-resistivity metal strapping, preferably 0.5 cm or 1 cm wide and more preferably 2 to 5 cm wide or wider, can also be used, as illustrated in FIG. 7. The apparatus of FIG. 7 includes a chamber as pictured in FIG. 2, and a power applicator in the form of a single, U-shaped strap-conductor 39' disposed around the chamber. A bank of capacitors 40' is electrically connected between the open ends of the U-shaped strap, and power is supplied through leads connected to the ends of the strap in the manner pictured in FIGS. 6 and 10.

The strap 39' encircling the chamber has an axial dimension, and provides an axially extending array of current paths around the chamber. Straps advantageously provide a low impedance, leading to higher current flow for equivalent applied voltage and power. The impedance of the applicator should preferably be matched to the impedance of the rf power supply. A single strap encircling the chamber and having a width as great or greater than the length of the desired plasma along the longitudinal axis of the chamber is quite effective in achieving good power transfer to the plasma. The strap enables the redistribution of current along the longitudinal axis of the chamber, to achieve more uniformity of current distribution. Also, the single-strap conductor provides a magnetic field that is axially more uniform than readily achieved with multiple-turn coils. Cooling can be provided by gun-drilled internal passages or by fins or cooling tubes welded to the strapping, but is not needed when the strap remains sufficiently cool during use, e.g., because of the large surface area of the strap.

The current-carrying conductors of the power applicator may be embedded in, or lie against, the surface of an enclosure or chamber having sufficient electrical insulation to separate the conductor of the power applicator from the conductive sidewalls of the plasma chamber. Preferably the current-carrying conductors are free-standing and spaced from the enclosure, which permits easy placement and removal of the enclosure within the applicator. Such an arrangement permits an applicator to be conveniently used sequentially with multiple enclosures. When the current-carrying conductors are spaced from the enclosure, they preferably are within about 1 cm(½"), more preferably within about 0.25 cm (1/10"), from the outer chamber wall and configured to the shape of the chamber.

Although it is preferred that the conductor loops completely encircle the chamber, the invention may also be practiced with conductors that partially encircle or pass through the container, e.g., with the length 39a of the conductors 39 passing through the center of the chamber (electrically insulated from the electrically conductive chamber sidewalls and surrounded by seals to maintain control of pressure) and perpendicular to the longitudinal axis of the chamber. A plasma sheath will be generated within the chamber between the conductors and the sidewalls of the chamber that lie within the conductor loop.

High-frequency current in the applicator produces a high-frequency magnetic field that extends through the chamber parallel to the longitudinal axis. The magnetic field induces a current in the conductive bars, which flows around the circumference of each bar transverse to the longitudinal axis of the bar, as shown by the arrows 44 in FIGS. 3 and 5. The currents flowing in the conductive bars serve to screen the magnetic field from the interior of the bars, but the gaps or slots allow the applied magnetic field to penetrate into the interior of the chamber. The currents flowing in the conductive bars also establish a magnetic field component in the chamber volume. The net of these effects results in a field pattern in the chamber modified so that it appears to come from an applicator that is closer to the chamber by a distance approximately equal to the thickness of the bars, and this improves the uniformity of the plasma (this is the so-called flux concentrating effect).

The chamber sidewalls serve to shape and confine the plasma generated. Within the chamber 11 the magnetic field is uniform and intense in comparison to the magnetic field generated outside the applicator and outside the chamber 11. Notwithstanding that the sidewalls are electrically conductive, a plasma is generated by the magnetic field and is bounded by the sidewalls.

The applicator should have a width sufficient to cover a substantial portion of the length of the chamber so as to generate a plasma over a substantial part of the length of the chamber. Similarly, the longitudinally extending gap or gaps should extend over the length of the chamber to contribute to formation of a plasma-generating magnetic field extending over a substantial part of the length of the chamber. Generally the applicator will have a width equal to at least 50 percent of the length of the longitudinally extending gap(s), and preferably at least 65 percent or 75 percent of the length of the gap(s). On the other hand, electric power that is dissipated by heating end walls (e.g., 22 and 23) that connect the electrically conductive bars is generally wasted, and therefore there is generally no benefit with chambers as illustrated in FIGS. 1–5 for the applicator to have a width greater than 90 percent of the length of the longitudinally extending gap(s). The plasma generated generally has a length somewhat less than the width of the applicator.

Figure 9:
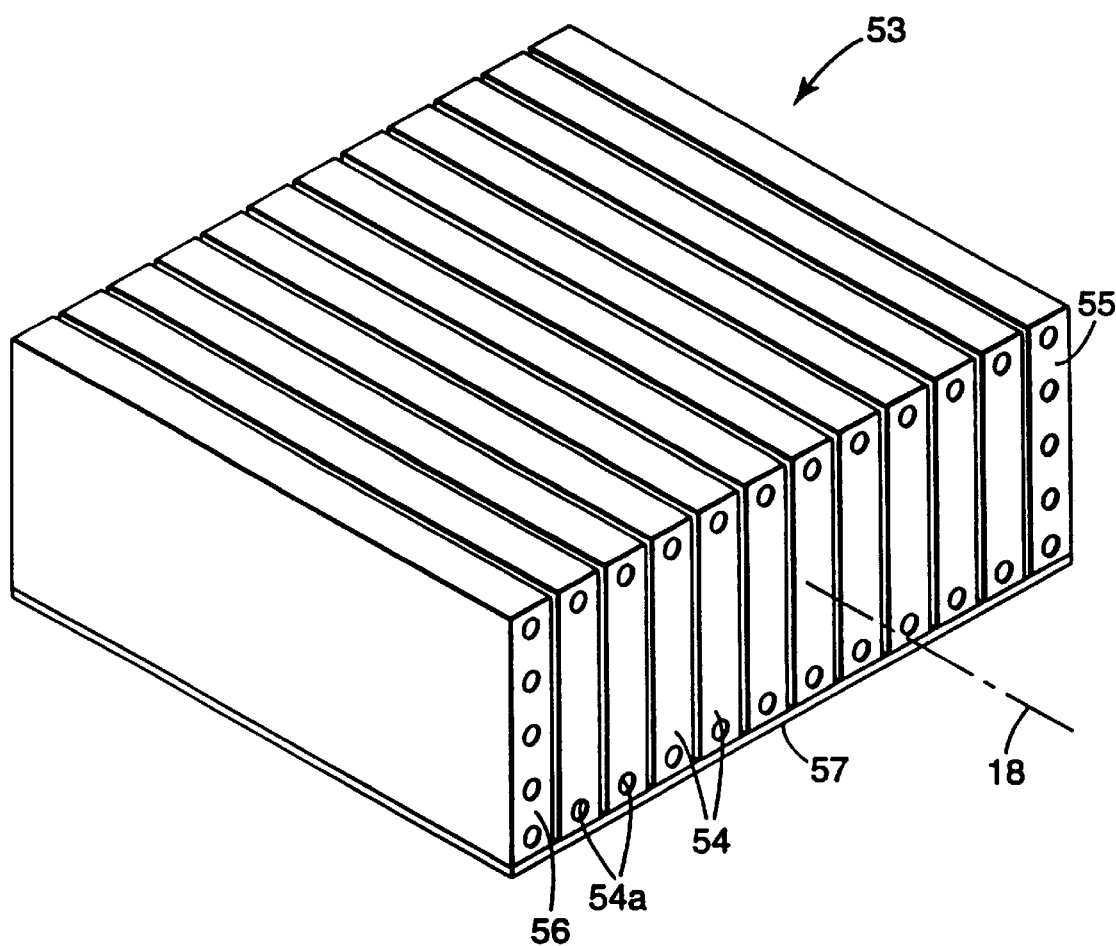
FIG. 9 is a perspective view of portions of another alternative enclosure and chamber for use in the invention.

If the end plates are made of a dielectric material and the gap(s) extend to the end plates, or in the case of the "picture frame" construction of FIG. 9, where the gaps extend through the end of the chamber, the applicator can extend the full length of the gaps and the magnetic field lines can enter and leave the applicator through the gaps. In this case the whole area of the chamber walls can be used for treatment or deposition.

Figure 8:
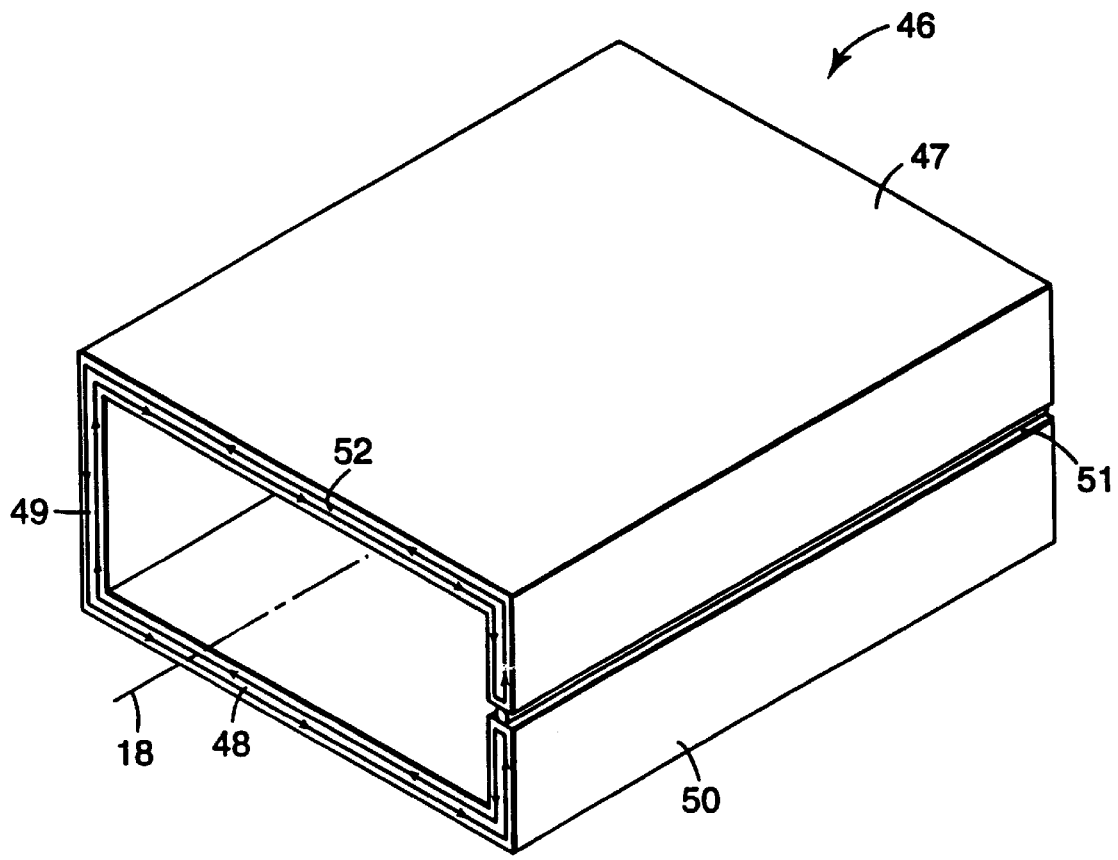
FIG. 8 is a perspective view, partially in section, showing portions of an alternative enclosure and chamber for use in the invention.

FIG. 8 shows an alternative chamber 46, which is also useful in the invention. The chamber 46 comprises sidewalls 47, 48, 49 and 50 which, except for a single longitudinally extending gap or slot 51, are continuous (e.g., made of plates fused together where joined; or extruded or cast as a unitary piece). When disposed in the magnetic field produced by an array of conductor loops such as the array of conductor loops shown in FIG. 6, a current 52 is induced in the sidewalls. As seen, the current 52 travels around the outer perimeter of the sidewalls, and because the slot 51 interrupts the current path, the current returns on the inner surface of the chamber to form a continuous closed-loop current path. The current along the inner surfaces of the sidewalls develops a magnetic field in the interior of the chamber, and the field is generally the same as the field that would have been developed by the array of conductor loops if the metal conductive chamber 46 were replaced by a dielectric chamber.

To assure against dielectric breakdown across the gap 51, an electrical insulator, such as Teflon or quartz, may be disposed within the gap. Also, enclosure means to seal the gap, such as a glass plate adhered to the outside of the sidewall 50 and end plates to close the ends of the chamber, allows pressure to be controlled within the chamber.

In other embodiments, two or more gaps or slots may be used in the sidewalls. The multi-gapped chamber of FIGS. 1–5 is preferred, especially for high-power applications. The multiplicity of gaps divides the voltage between the gaps and hence reduces the possibility of undesirable arcing across the gaps. Such arcing is a particular concern for high power levels, where the voltage across a gap can be large.

The width of the gaps or slots is desirably kept small to minimize exposure of the dielectric enclosure plates (e.g., 26, 27 and 28). Preferably, the gaps or slots are less than 20 millimeters wide, and more preferably are about 1 to 5 millimeters wide. The gaps may be filled with electrical insulation or may be unfilled.

Enclosure means in the form of plates covering and sealing the slots are convenient and effective, and provide a compact structure. A tempered glass plate is desirable because of its dielectric character, allowing magnetic field from the applicator to penetrate into the chamber. Because of the cooled nature of the sidewalls of the chamber, and the narrow span of the slots, lower-temperature-resistant dielectric materials can be used such as a tempered glass or polycarbonate. Other useful enclosure means include a self-supporting housing totally surrounding the plasma chamber, which may also enclose the power applicator.

Another alternative enclosure 53 is shown in FIG. 9. The enclosure 53 comprises a stack of sidewall elements 54, each of which comprises four bars connected together like a picture frame, i.e., so as to describe the four sides of a rectangle and surround an interior space. Endplates 55 and 56 are at the ends of the stack. The elements 54 are stacked in close spacing with one another, separated by O-rings (not shown) having a rectangular shape that generally matches the rectangular shape of the elements 54. The stack is held in compression by connectors (not shown) that pass through the endplates and elements 54, or that alternatively engage the endplates in a clamping type means. Bores 54a are provided in the bars of the elements 54 for circulation of a coolant. The enclosure 53 is disposed within the conductor array of an applicator as shown in FIG. 6, with the longitudinal axis 18 of the enclosure transverse to the conductor loops of the applicator. Enclosure means such as a dielectric plate 57 at the bottom of the array and another dielectric plate (not shown) at the top of the array allow pressure to be controlled in the chamber, and inlet and outlet means to introduce and remove gases can be provided in the manner shown in FIG. 2.

Charged species exist within the gaseous contents of the chamber, initiated for example by the electric field penetrating through the gaps 19 into the chamber, or by an ion-producing device disposed within the chamber, or by application of a sufficiently great magnetic field to the chamber. A useful ion-producing device, for example, may comprise a sharply pointed conductive rod made, for example, from tungsten disposed within the chamber and connected to a voltage source of 100 volts or more.

The charged species existing or generated in the chamber respond to the high-frequency magnetic field induced within the chamber such that a current loop transverse to the longitudinal axis of the chamber is induced within the gaseous material. The induced current loop forms near the radially outermost boundary of the chamber and is of lesser magnitude the greater its distance from the chamber wall (as understood in the art, the induced plasma currents are oriented so that their associated magnetic fields partially reduce the magnetic field produced by the current-carrying means, which is a progressively greater effect the greater the distance from the chamber wall). Work done by the induced plasma-current loop intensifies the ionization and dissociation of the gaseous species, producing an intense plasma sheath that conforms to the interior of the chamber wall. This plasma sheath extends in the axial direction of the chamber, because of the axially-extending nature of the power applicator, and because of the low pressures typically existing in the chamber. The plasma covers the sidewalls of the chamber inside of the applicator bounds, but is of lesser effect in the vicinity of the axial ends of the applicator. At planar chamber sidewalls a rather planar plasma sheath parallel to the chamber wall is formed, and at curved chamber sidewalls a plasma sheath that follows the curved surface is formed. The plasma expands to maximize the ratio between its cross-sectional area and the length of its perimeter.

Once formed, the induced current loop becomes the dominant mechanism by which the applied high-frequency power is transferred to the plasma. Increased power can be applied to cause increased dissociation and ionization.

The condition in which an intense plasma is formed by the induced current loop is termed magnetically induced ionization. When a plasma is initiated solely by a magnetically induced electric field, there is generally no visible luminosity prior to the onset of magnetically induced ionization. Once induced, there is often a visible difference in luminosity from the upper and lower sidewalls of the chamber 11 toward the center of the chamber.

Figure 3:
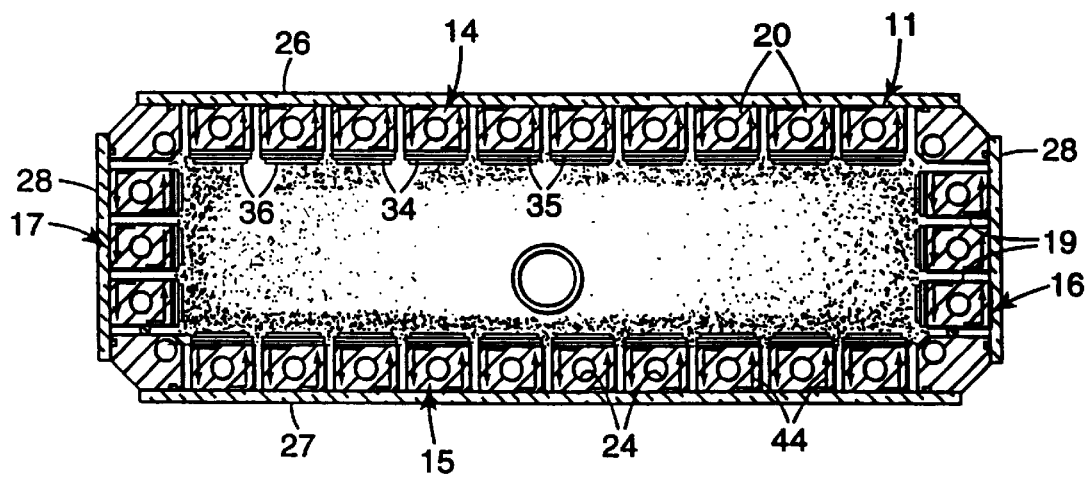
FIG. 3 is a sectional view along lines 3—3 in FIG. 2.

FIG. 3 is a sectional view through the chamber 11 taken during operation of the apparatus. The dots in the drawing represent the magnetically induced plasma within the chamber (actually the plasma is observed by its visible luminosity). As seen, the plasma is generally more intense or dense at its outer boundary adjacent the upper and lower chamber sidewalls, 14 and 15, and gradually declines in intensity the greater its distance from those sidewalls. ("Outer boundary" refers to the edges of the plasma sheath furthest from the center of the chamber, i.e., the edge adjacent the chamber sidewall.) The plasma density near perimeter regions of the upper and lower sidewalls (i.e., near the vertical sidewalls 16 and 17 or at the longitudinal ends of the chamber) is not as great as over more central regions of the upper and lower sidewalls 14 and 15 (if the vertical sidewalls were larger in area, the plasma density near them would also be greater; and in some embodiments the vertical sidewalls are larger and the upper and lower sidewalls are smaller). The lower plasma density near the vertical sidewalls makes them less useful for diamond deposition or other operations; while the densely packed magnetic flux lines near the upper and lower sidewalls of the chamber are very effective. For this reason, chambers having two large-area sidewalls separated by a narrow spacing are preferred for many embodiments of the invention.

At some distance from the sidewalls, the plasma intensity may decline to an extent that there is hardly any visible luminosity. Plasma intensities of $10^{12}$ electrons per cubic centimeter have been reported in the literature for magnetically induced ionizations, in contrast to electron densities of $10^{10}$ electrons per cubic centimeter reported for plasmas generated through so-called capacitive coupling; the latter occurs, for example, when an electric field (as opposed to a magnetically induced electric field) penetrates into the chamber of an apparatus of the invention and acts on the neutral gaseous contents of the chamber, e.g., during plasma initiation prior to achieving magnetically induced ionization.

As can be seen from FIG. 3, when gases are introduced into the chamber through a central inlet tube, they first diffuse through the relatively lower-density plasma to the higher-density plasma sheath. Such a path for the gas is considered advantageous, for example, to facilitate formation of carbon monoxide when vaporized water/alcohol mixtures are used, as shown in earlier patent applications Ser. No. 07/787,891, filed Nov. 5, 1991; Ser. No. 08/861, 291, filed May 14, 1993; and Ser. No. 08/151,184, filed Nov. 12, 1993. These patent applications, and a published PCT counterpart (WO 93/08927, published May 13, 1993) are hereby incorporated by reference.

The intense plasma has many benefits. For example, it produces rapid dissociation of diamond-precursor gaseous feedstocks so as to allow rapid deposition of diamond films. The conformance and proximity of the plasma sheath to the chamber wall, where diamond deposition occurs, is advantageous because dissociated diamond-forming species need travel only a short distance to contact the work surface. The high temperatures and high electron density produced in an intense plasma can be also used in other ways, such as to clean surfaces, etch surfaces, to incinerate waste materials or to deposit non-diamond materials. The intense plasma of the invention can generally be exploited for many other plasma processes typically operating at a scale smaller than possible through the invention, or operating at plasma densities smaller than those achieved through the inventions.

As previously noted, the sidewalls of the chamber can be used as a work surface, or a work surface can be supported on and generally conforms to the chamber sidewalls. Thus, the work surface is preferably disposed at and conforms to the radially outermost boundary of the plasma sheath (i.e., adjacent the sidewalls), where the plasma sheath is most intense and active; and the generally extensive work surface, which is typically planar but which may be curvilinear, is acted upon by the plasma sheath at this high intensity over a large percentage of the work surface. Large-area films can be deposited, or large-area surfaces cleaned, etched, etc. Work surfaces can also be located at other places in the plasma sheath, though they generally extend in the direction of the longitudinal axis (i.e., at least a major portion of the work surface extends in the direction of the longitudinal axis and preferably is parallel to the longitudinal axis) and preferably have a shape conforming to the contour of the plasma sheath.

The power supply to the applicator generally may be any type known to those skilled in the art. The desired power level varies with the pressure in the chamber and the ionization potential of the gas in the chamber; the type of deposition, etching, or cleaning, or other operation to be carried out; the rate of throughput desired; the temperature ranges appropriate for materials and substrates being used, etc. The needed power to induce ionization can readily be determined in many cases from reported relationships between power level, pressure, and desired gases; and simple experimentation along generally understood principles can be used for nonreported materials or to further define the needed and preferred conditions.

For diamond deposition using water-ethanol mixtures, power levels of about 7 watts or more per square centimeter have been sufficient to deposit diamond at a rate of about 1 $\mu$m/hr. (Power density is calculated by dividing the power dissipated in the chamber by the area of the longitudinally extending sidewalls of the chamber; the power dissipated in the chamber can be measured, or it can be calculated with rather good accuracy by multiplying the initial applied dc power by the efficiency of the applicator, which for an applicator of the type illustrated is generally on the order of 65 percent). Higher power densities, which increase the rates at which the atomic hydrogen and carbon radicals are generated can be used to increase the rate of diamond deposition or other operation. Power densities of 20, 50, or 100 W/cm$^2$ or more are contemplated for different needs and circumstances. While not rigorous, diamond-forming feedstocks such as hydrogen-methane mixtures generally require higher power densities than water-ethanol mixtures. At gas pressures less than 0.05 Torr, magnetically induced ionization is generally achieved with power densities of two or three watts per square centimeter of chamber sidewall.

Figure 11:
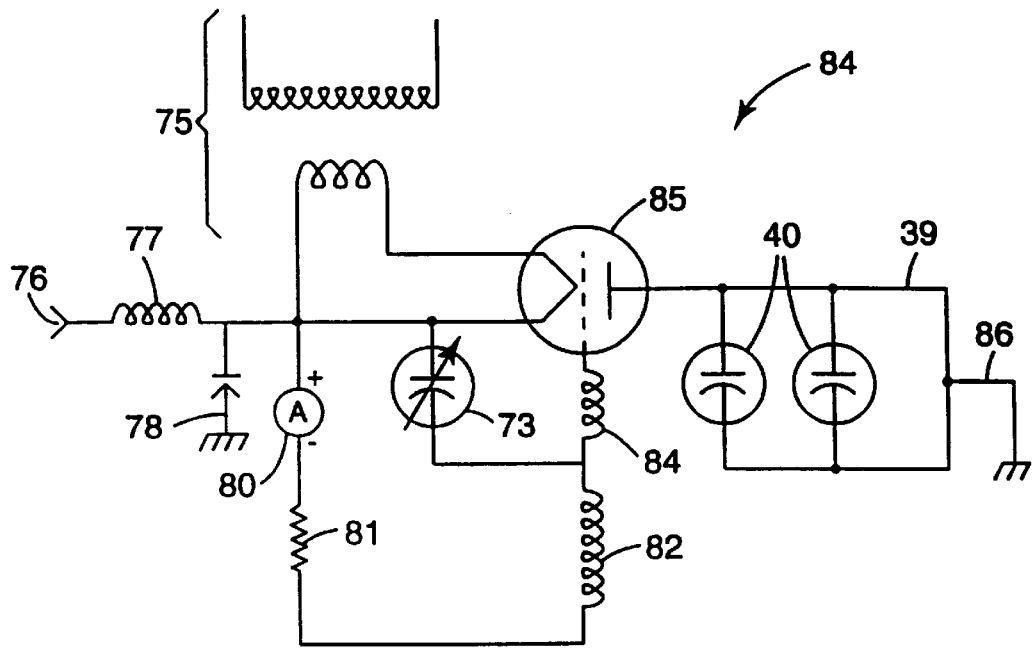
FIG. 11 is a diagram of another power supply useful in the present invention.

RF power supply units are commercially available, for example, from Lepel Corporation (e.g., Model NO. T-40-3-DF4-TL). Schematic diagrams of other useful rf power supplies are shown in FIGS. 6 and 11. FIG. 6 shows a rf power supply 60 which provides variable coupling control. The rf power supply comprises a high voltage variable DC power source 61 connected through rf choke coil 62 to the plate of vacuum tube 63. The switching on and off converts the dc supply energy to high-frequency energy. Vacuum tube 63 is connected to grid complex-impedance circuit 64 and primary tank coil 65, which has variable tank capacitance. Primary tank coil 65 and coupling-link coil 66 comprise the matching network. The coupling-link coil 66 is connected between the bus bars 41 and 42, which are connected to the conductor loops 39 and capacitor bank 40.

FIG. 11 diagrams another rf power supply having a direct coupled circuit 74. The circuit comprises a transformer 75 from which an auxiliary source 76 supplies source energy to the oscillator filament. Inductor 77 and capacitor 78 form a decoupling circuit through which dc energy is supplied. Meter 80, resistor 81, rf choke inductor 82, variable capacitor 83, and inductor 84 comprise a grid circuit complex impedance. Vacuum tube 85 switches the dc energy to high frequency energy, generates the rf current, and is connected to the capacitors 40 and current-carrying conductors 39 through bus bars such as 41 and 42 in FIG. 6. The connection 86 to ground affords a dc return path from the vacuum tube to the power supply.

The power supply provides a high- frequency current to the applicator, by which is meant herein a frequency between about 60 Hz and 100 MHz, where induction-coupled plasmas have been operated using other applicators and applicator geometries. The power supply preferably operates at about 0.5 to 20 MHz, more preferably at about 4 to 15 MHz. Such frequencies are within the band commonly referred to as radio frequency. Government regulators have allotted 13.56 MHz for industrial uses, and that is a suitable frequency for use in the invention. Power supplies operating at kilohertz ranges (e.g., 400 kH$_z$) have also been used advantageously.

Figure 13:
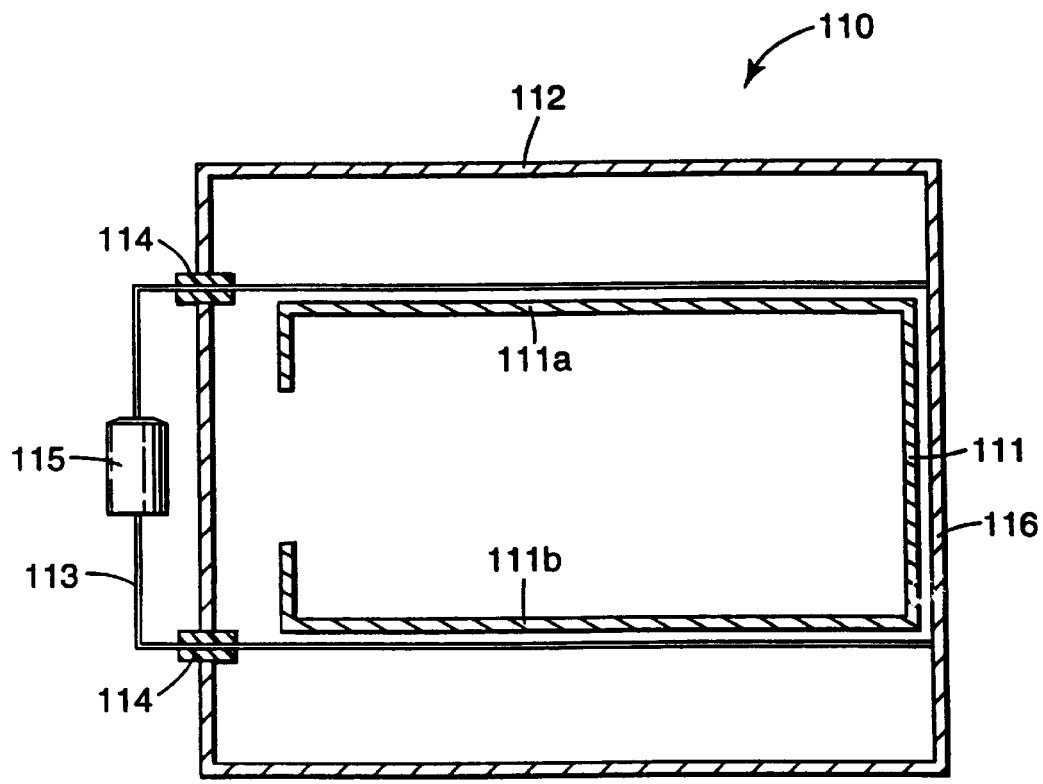
FIG. 13 is a sectional, schematic view of another alternative enclosure and chamber for use in the invention.
Figure 12:
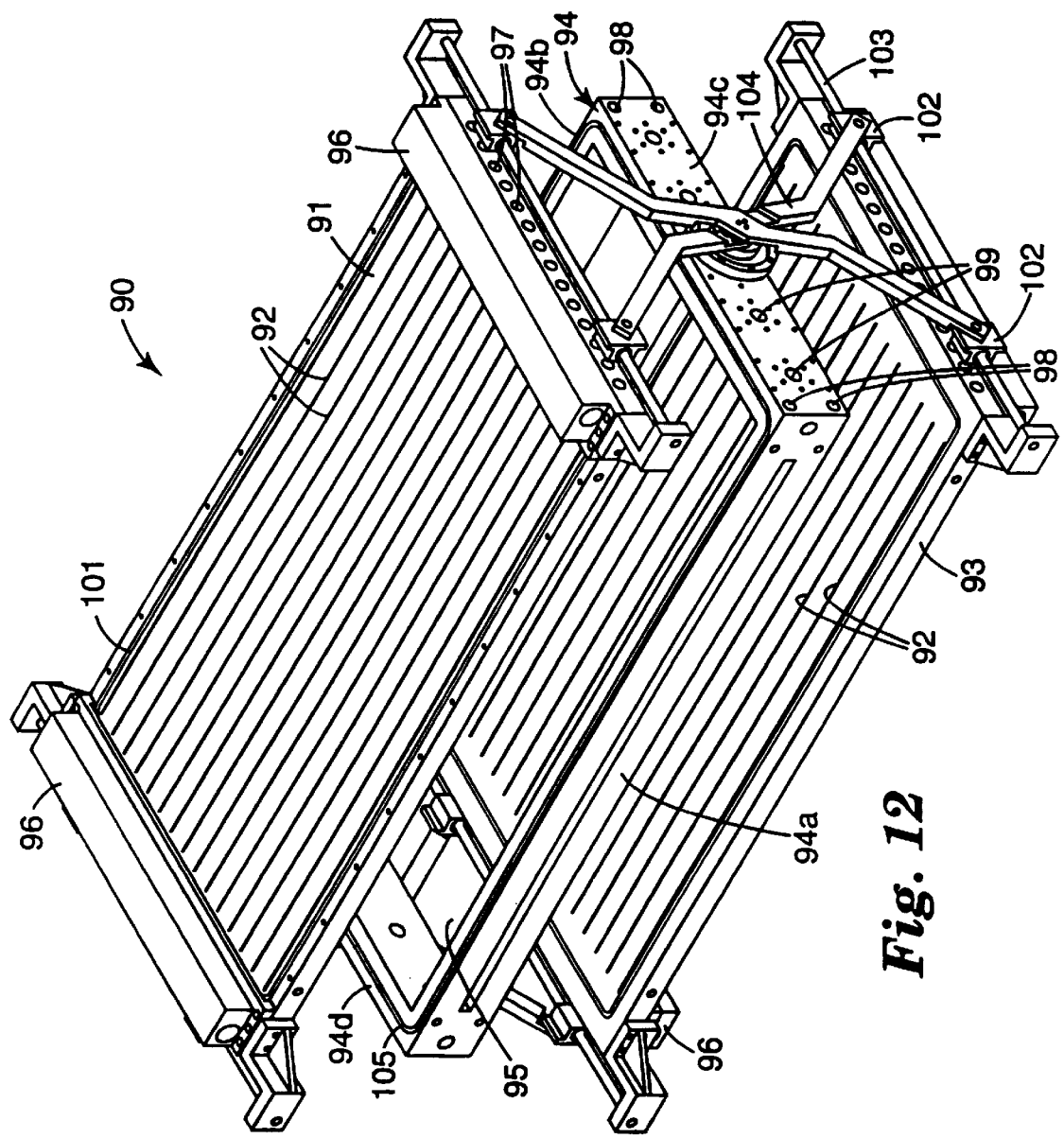
FIG. 12 is a perspective and exploded view of another alternative chamber for use in the invention.

Further variations of enclosures and chambers useful in the invention and illustrated in FIGS. 12 and 13.

The chamber 90 pictured in FIG. 12 comprises a top plate or sidewall 91 in which slots 92 have been cut or machined, a similar bottom plate or sidewall 93, and a collar 94 that separates the top and bottom sidewalls 91 and 93. The collar 94 can be machined from a single plate, with the side portions 94a and 94b serving as vertical sidewalls and the portions 94c and 94d serving as endwalls for the chamber 90. The portion of the collar 94 removed becomes the interior space 95 of the chamber where a plasma is generated and work performed. As seen, there are no gaps in the vertical sidewalls 94a and 94b. Bores (not shown) are drilled in the sidewalls 91 and 93 between the slots 92 for cooling water, and headers 96 are mounted on the sidewalls to distribute the water to the bores. Plugs 97 closing the ends of the bores are shown in FIG. 12.

Bores 98 are also formed in the sidewalls 94a and 94b; and a multitude of holes (not shown) are formed between these bores and the interior of the chamber over the length of the sidewalls 94a and 94b; reactant gases are introduced into the chamber through these holes in a direction transverse to the longitudinal axis of the chamber. Exhaust gases leave the chamber from holes 99 at the ends of the chamber through endwalls 94c and 94d.

Dielectric plates (not shown) are disposed over the outside of the sidewalls 91 and 93 to seal the chamber. The plates engage O-rings 101 resting in grooves in the sidewalls 91 and 93. The sidewalls 91 and 93 are mounted through sliders 102 carried on a rod 103 to an X-hinged apparatus 104, which is pivotally centrally mounted on the collar 94. With this apparatus, the chamber can be readily opened and closed to provide access to the chamber interior. O-rings 105 in the collar engage the sidewalls 91 and 93 when the chamber is closed to provide a seal at the point of closure.

FIG. 13 shows another enclosure 110 of the invention incorporating chamber 111 similar to the chamber 46 show in FIG. 8. In this embodiment however, the enclosure means comprises an outer container, e.g., a metal box 112 that totally encloses the chamber 111. A vacuum is maintained in the whole of the container 112, and conductors 113 are introduced through rings 114 that insulate the conductors from the metal wall of the container 112 and maintain the vacuum seal. Capacitors 115 resonate the system. The conductors 113 can be joined to the rear wall 115 of the container so the circuit is completed through the wall 116. Plasma is generated within the chamber 111 and extends along the longitudinal axis of the chamber, which is perpendicular to the page of the drawing. Instead of the container 111, plates corresponding to the top and bottom walls 111a and 111b could be used alone.

Various feed stocks may be supplied to the chamber depending on the function to be performed, for example, deposition of diamond or other materials, etching, cleaning, or pyrolysis. The feedstock is generally gaseous, or vaporizes to a gaseous form upon introduction into the chamber. Suitable diamond-forming feedstock gases include a mixture of alcohol and water. Alcohols suitable for use in the invention include methanol, ethanol, and isopropanol. Ethanol is a particularly preferred alcohol. The ratio of alcohol to water is preferably in the range of about 1:1.5 to 4:1, more preferably in the range of about 1:1 to 2:1, most preferably 1:1 to 1.2:1.

Diamond films may be deposited onto substrates and removed to provide a self-sustaining film useful for a wide variety of purposes. Such films can be advantageously used as a heat sink or thermal spreader (owing to the combination of high thermal conductivity and high electrical insulation value for the films) in various electronic devices. Diamond films can also be used in electronic devices as field emitters, e.g., for flat panel displays or cold cathodes. Diamond films can also be permanently deposited on a variety of substrates such as cutting tools (e.g., sharp-pointed or sharp-edged metal pieces) or abrasive products such as abrasive sheets or wheels.

For depositing films other than diamond, silane-containing feedstocks can be used with oxygen for $SiO_2$ deposition, with nitrogen for $Si_3N_4$ deposition, and with methane for SiC deposition; or proportionate mixtures can be used for various silicon alloys.

For etching or priming, i.e., removal of surface material, the gas choice is highly dependent on the surface to be etched. For silicon surfaces, molecular $H_2$ can be used as well as $CF_4/O_2$ mixtures. For polymeric surfaces, oxygen-rich gases such as $O_2$, $H_2O$, $N_2O$ or $H_2O_2$ can be used.

For cleaning of substrate surfaces to remove residual carbon, oil, or adhesive, oxygen-based feedstocks such as $O_2$, $H_2O$, $N_2O$ or $H_2O_2$ are suitable.

When the apparatus of the current invention is used for hazardous waste destruction, the hazardous material must present itself in vapor form or be entrained in a process gas stream. For example, destruction of trichloroethylene can be performed by entraining the liquid in a gas stream containing $O_2$ and $H_2$. The resultant gas stream contains CO, HCl, and $H_2O$. The HCl and $H_2O$ is condensed from the gas stream and neutralized, and the CO is burnt to $CO_2$.

EXAMPLE 1

A polycrystalline diamond film was produced using a chamber as generally shown in FIGS. 1–5 and an applicator generally as shown in FIG. 6. The chamber comprised thirty two copper bars assembled into the general configuration shown in FIG. 1, but arranged as two chamber halves (a base plate and a rectangular domed structure resting on the base plate) which can be conveniently separated for access to the interior of the chamber. The copper bars 20 forming the lower sidewall 15 were silver-soldered at each end into sockets 21 of copper plates 22a and 23a that form the lower portion of the end plates 22 and 23 (see FIG. 2, where the end plate 22 is pictured). Together, the bars 20 of the lower sidewall 15 and the end plates 22a and 23a formed the lower base plate for the chamber. The remaining bars, which comprised the domed top half of the chamber, engaged in the sockets 21 of aluminum plates that formed the large remaining part 22b and 23b of the end plates 22 and 23; the bars were inserted into the sockets 21. The assembled base plate was grooved around its outer perimeter to receive an O-ring against which the lower edge of the domed top half of the chamber was pressed and held by a fixture (not shown). Viewing ports 88 covered with a tempered glass were included to allow observance of the inside of the chamber during operation.

The copper bars were square in cross section and had a size of approximately 1.25 inch (3.175 cm) on a side. The gap between the bars was about 1/16 inch (1.6 mm) in width. Each bar had a 3/8-inch-diameter (9.5 mm) cylindrical bore drilled in it for circulation of coolant. Overall the chamber had a flat shape, with a width of 17 inches (43 cm), a length of 30 inches (76 cm), and a height of 6.5 inches (16.5 cm). The interior of the chamber had a width of 14.5 inches (37 cm), a length of 26 inches (66 cm), and a height of 4.0 inches (10 cm). A one-half-inch-thick (1.27 cm) sheet of tempered glass was adhered over the outside of each of the upper and lower sidewalls and the vertical sidewalls of the chamber.

The described flat chamber lay within the array of U-shaped conductors. The power applicator consisted of a series of ten one-inch-diameter copper tubes which had been silver plated on their exterior surface. The tubes were electrically connected in parallel and had an elongated "U" shape, with a capacitor bank electrically connected between the open ends of the "U." Each U-shaped tube had a 24-inch-long (61 cm) top leg extending across the chamber from the top of the capacitor bank, a 10-inch-long (25 cm) vertical leg, and a 24-inch-long (61 cm) bottom leg lying underneath the described flat chamber and connecting to the bottom side of the capacitor bank. The applicator was centered around and over the chamber.

The applicator array had a length along the longitudinal axis of the chamber of 12 inches (30 cm), so the array covered only the middle portion of the 30-inch (76 cm) length of the chamber. The longitudinal gaps between the bars were about 24 inches (61 cm) long. In an arrangement as described, a plasma is formed that visibly extends over about 9–10 inches (23–25 cm) of the middle length of the chamber.

To provide a thermal stage upon which diamond could be produced, fused silica plates (34 in FIG. 5) which were 25-mm×25-mm×3.125 mm in dimension were adhered to the copper bars using a thermally conductive adhesive tape (35) (3M Tape No. 9885). The fused silica plates were placed on the inside of the upper sidewall, on the vertical sidewalls, and lower sidewall over a central region of the chamber extending about 25 cm along the longitudinal axis of the chamber. The fused silica plates provided a thermal impedance between the plasma and the relatively cold copper bars, which had cooling water circulating through the channels totaling 47 liters per minute for the chamber. In addition, on the lower sidewalls only, 25 mm×25 mm×0.25 mm silicon wafers (36) were placed on top of the fused silica plates.

The system was evacuated, and a gas vapor stream comprising 6 sccm water vapor and 20 sccm ethanol vapor was admitted to the system. An induction plasma was initiated at 0.366 Torr using a dc input power of 10 kw. The pressure and power were ramped to 0.706 Torr and 24 kW, respectively, and the water vapor flow rate was increased to 12 sccm. Calorimetry on the cooling water showed the rf input power to the system to be about 16 kW. The plasma was extinguished momentarily to visually inspect the black body emission from the silicon wafers; this showed the central region to be at about 750° C. The temperature of the copper tubes was measured at about 50° C. and the fused silica plate exterior surface was calculated from the heat flux to be about 400° C.

Diamond deposition was then continued for 1.5 hours, at which time the plasma was ended, the system vented, and four silicon wafers removed. The samples examined showed diamond nucleation and growth.

Four additional silicon wafers were introduced in the place of those removed, and the system re-started. The water vapor stream was increased to 17 sccm, and diamond growth continued under the following conditions for 4.25 hours.

| | |
|---|---|
| $H_2O$ | 17 sccm |
| $C_2H_6O$ | 20 sccm |
| plate voltage: | 9.37 kV |
| plate current: | 2.670 A |
| grid current: | 0.342 A |
| DC input power: | 25 kW |
| dissipated power: | 17.5 kW |
| frequency: | 7.819 MHz |

Upon plasma termination, the samples were removed from the system and examined by SEM and Raman spectroscopy. An area about 20 cm long and 30 cm wide over the base plate showed faceted diamond crystals. The central region of this area showed larger crystal size than perimeter regions (i.e., at the extreme longitudinal ends of the area of the plasma, at the edges of which the plasma was reduced or non existent, and at the sides near the vertical sidewalls) indicating a higher growth rate in the center. Raman analysis showed a distinct 1332 $cm^{-1}$, peak for material from the central plasma region while material near the perimeter region was of poorer quality. Growth rates were observed to vary between 1.3 $\mu$m/hr. in the center to 0.4 $\mu$m/hr in the perimeter region.

EXAMPLE 2

Apparatus similar to that described in Example 1 was used to prepare polycrystalline diamond films. Silicon wafers were placed on top of the fused silica plates adhered to the copper bars of the lower sidewall. The system was evacuated and a mixed flow of water vapor and ethanol vapor was used to purge the system for about 15 minutes. A 12 kW dc-input power plasma was initiated with a gas flow of 6 sccm water vapor and 20 sccm ethanol vapor. The dc-input power and pressure were ramped to 25 kW and 0.708 Torr, respectively. After 15 minutes, the water vapor flow was increased to 17 sccm. The plasma was momentarily extinguished to check the temperature of the silicon wafers, which was found to be about 750–800° C. The growth conditions were re-established with the following conditions.

| | |
|---|---|
| $H_2O$ | 17 sccm |
| $C_2H_6O$ | 20 sccm |
| plate voltage: | 9.35 kV |
| plate current: | 2.63 A |
| grid current: | 0.34 A |
| DC input power: | 29.6 kW |
| dissipated power: | 18.0 kW |
| frequency: | 7.799 MHz |

Upon plasma termination, samples were removed from the system. The thickest regions showed 300 $\mu$m of diamond growth on the silicon wafers. A micrometer was used to measure the film thickness. SEM micrographs showed excellent faceting and very large crystallites (about 70–100 $\mu$m in diameter). Raman analysis showed the films to have a very sharp 1332 $cm^{-1}$ line with FWHM 2.5 $cm^{-1}$, but it also showed some non-diamond components. Some regions of the lower sidewall did not produce high quality diamond. In those areas, spherical graphitic deposits developed into macroscopic graphitic balls. However, diamond growth directly on the fused silica plates attached to the upper sidewall showed high quality growth over nearly the entire area (an area 20×35 cm covered by the fused silica tiles).

EXAMPLES 3 AND 4

Diamond film was prepared using an enclosure as pictured in FIG. 12, with either a parallel-conductor applicator as pictured in FIG. 6 (Example 3) or a strap applicator as pictured in FIG. 7 (Example 4). The chamber 90 of the enclosure consisted of two aluminum plates (91 and 93) (6061 aluminum) mating against an aluminum collar 94 as shown in FIG. 12. The top and bottom plates 91 and 93 were 17 inches by 35 inches in area and one inch thick. Fifteen slots were formed in the plates by water-jet cutting, each slot being 0.05 inch wide and 30 inches long, and separated (center-to-center) by 1.063 inch. Fourteen 0.5-inch-diameter gun-drilled bores with a spacing of 1.063 inch were provided for cooling water. The aluminum collar 94 was fabricated from three-inch-thick aluminum plate, 17 inches by 35 inches in area. The center portion of the plate was removed, leaving walls 94a and 94b one inch thick and walls 94c and 94d 1.5 inch thick. Two bores one-inch in diameter were then drilled through each of the sidewalls 94a and 94b, and a multitude of 0.03-inch-diameter holes were formed along the length of the walls 94a and 94b from those bores to the interior of the chamber 95. The exhaust gas ports were 0.625-diameter-inch in diameter. Four 0.625 inch-windows were mounted in each of the walls 94c and 94d to enable viewing of the plasma.

Vacuum sealing of the slots was accomplished by means of polyethermide dielectric plates (17 inches by 30 inches in area and one-inch thick) sealing against the O-rings 101 along the outer periphery of the top and bottom sidewalls 91 and 93. Vacuum sealing between the collar and the top and bottom sidewalls was accomplished through O-rings 105 captured in grooves machined in the aluminum collar.

For the parallel-conductor applicator as pictured in FIG. 6, the conductors 39 comprised 0.5-inch-diameter-soft copper tubing. Twelve conductors spaced 1.5 inch apart were used. The ends of the 12 conductors were attached to water-cooled headers by means of tube fittings.

The flat-strap applicator was formed from 0.125-inch-thick, 18-inch-wide-inch-wide, electronic-grade copper plate, bent in a "U"-shape, with the legs of the "U" each 19 inches in length and the connecting base of the "U" 6.5 inches in length.

The power supply was a conventional megacycle induction heating power supply manufactured by Lepel Corporation (T-40-DF). The tank circuit of this power supply was modified to have a capacitance of 1800 pF (four 450 pF vacuum capacitors). The tap setting of the internal inductor was set to zero and the output terminals were directly connected to a bus bar for the parallel-conductor applicator or to the flat-strap applicator itself. The entire tank inductance is therefore that of the applicator (barring the inductances of the connections).

The apparatus was operated in both examples with a water-vapor flow rate of 15.6 sccm, and an ethanol-vapor flow rate of 19.2 sccm, and the pressure inside the chamber was maintained at 3.60 mTorr. The oscillator and power coupling parameters were as follows:

|  | Parallel-Conductor Applicator | Flat-Strap Applicator |
| --- | --- | --- |
| DC Plate Voltage | 10 kV | 9 kV |
| Plate Current | 4.0 A | 5.9 A |
| RF Coil Voltage | 15 kV | 10 kV |
| Frequency | 3.998 MHz | 4.643 MHz |
| DC Plate Power | 45 kW | 53.1 kW |
| Dissipated Power | 18.5 kW | 22.8 kW |
| Deposition Area | 8" × 14" | 12" × 14" |
| Max. Operating Pressure | 450 mTorr | >850 mTorr |

Diamond was deposited over an area 8 inches by 14 inches in the parallel-conductor applicator and over an area 12 inches by 14 inches in the flat-strap applicator.

What is claim as new and desired to be secured by Letters Patent of the United States is:

1. A method for destruction of hazardous gaseous material, comprising:
    a) providing a chamber having a longitudinal axis and longitudinally extending electrically conductive sidewalls, at least one sidewall having a longitudinally extending gap that interrupts a current path through the sidewalls transverse to the longitudinal axis;
    b) providing an axially-extending array of current-carrying conductor paths that at least partially encircle the chamber and are transverse to the longitudinal axis of the chamber;
    c) providing the hazardous gaseous material in the chamber at a controlled pressure; and
    d) providing high-frequency current in the conductor paths in a magnitude to magnetically induce ionization of the gaseous material in the chamber and form a plasma sheath that surrounds and extends along the longitudinal axis and conforms to the sidewalls of the chamber in which the hazardous gaseous material is converted to a non-hazardous form.

2. Apparatus for destruction of hazardous waste material, comprising:
    a chamber having a longitudinal axis and longitudinally extending electrically conductive sidewalls, at least one sidewall having at least one longitudinally extending gap that interrupts a current path through the sidewails transverse to the longitudinal axis;
    enclosure means sealing the chamber to allow pressure inside the chamber to be controlled;
    means for providing the hazardous waste material in the chamber;
    an axially-extending array of current-carrying conductors that at least partially encircle the chamber, are transverse to the longitudinal axis, and establish a magnetic field parallel to the longitudinal axis of the chamber; and
    a power supply connected to the conductor array and adapted to provide high-frequency current in the conductors to magnetically induce ionization of the hazardous waste material in the chamber and form a plasma sheath that surrounds and extends along the longitudinal axis and conforms to the sidewalls of the chamber.

3. An apparatus for destruction of hazardous waste material, comprising:
    a chamber with a longitudinal axis and longitudinally extending electrically conductive sidewalls, at least one sidewall having at least one longitudinally extending gap that interrupts a current path through the sidewalls transverse to the longitudinal axis;
    a mechanism configured to seal the chamber to allow pressure inside the chamber to be controlled;
    a plasma generation device configured to magnetically induce a plasma inside said chamber by producing a high frequency magnetic field outside the chamber which penetrates the at least one longitudinally extending gap into the chamber; and
    an introduction device configured to introduce the hazardous waste material into the chamber whereby the hazardous waste material is dissociated by the high frequency magnetic field inside the chamber and converted to gas by-products.

4. The apparatus of claim 3, further comprising:
    an outlet port connected to the chamber and configured to exhaust the gas by-products from the chamber.

5. The apparatus of claim 4, wherein the plasma generation device comprises:
    an axially-extending array of conductors that at least partially encircle the chamber and are transverse to the longitudinal axis of the chamber; and
    a power supply connected to the conductor array and adapted to apply to the conductors a high-frequency current to produce said high frequency magnetic field.

6. The apparatus of claim 4, wherein the plasma generation device comprises:
    a series wound coil that encircles the chamber, said coil having a coil axis substantially parallel to the longitudinal axis of the chamber; and
    a power supply connected to the series wound coil and adapted to apply to the coil a high-frequency current to produce said high frequency magnetic field.

7. The apparatus of claim 4, wherein the introduction device is configured to supply a gaseous feedstock containing the hazardous material.

8. The apparatus of claim 7, wherein the introduction device further comprises:
    a central inlet tube mounted on an end plate connected to the chamber, said tube extending towards the center of the chamber; and
    circular openings about an end of said central inlet tube opposite the end plate, configured to distribute the gaseous feedstock containing hazardous material into the chamber.

9. The apparatus of claim 7, wherein the introduction device comprises:
    a plurality of ports provided into the chamber and configured to introduce hazardous waste material into the chamber.

10. The apparatus of claim 4, wherein the introduction device is configured to supply a liquid containing the hazardous material into the chamber so that upon supplying the liquid, said liquid vaporizes upon entry into chamber.

11. The apparatus of claim 4, wherein the introduction device is configured to supply a solid containing the hazardous material into the chamber so that upon supplying the solid, said solid sublimes upon entry into chamber.

12. A method for destruction of hazardous waste material, comprising the steps of:

provbiding a chamber with a longitudinal axis and longitudinally extending electrically conductive sidewalls, at least one sidewall having at least one longitudinally extending gap that interrupts a current path through the sidewalls transverse to the longitudinal axis;

generating outside the chamber a high frequency magnetic field which penetrates through the at least one longitudinally extending gap to produce a high frequency magnetic field inside the chamber;

introducing the hazardous waste material into the chamber; and dissociating the hazardous waste material by means of the high frequency magnetic field inside the chamber.

13. The method of claim 12, further comprising the steps of:

producing converted by-products of the dissociated hazardous waste material; and exhausting a resultant gas stream of the converted by-products from the chamber.

14. The method of claim 13, wherein the step of introducing the hazardous waste material further comprises the step of:

introducing a gaseous feedstock of the hazardous waste material.

15. The method of claim 14, wherein the step of introducing the hazardous waste material further comprises the step of:

injecting the gaseous feedstock into the center of the chamber.

16. The method of claim 13, wherein the step of introducing the hazardous waste material further comprises the step of:

supplying the hazardous waste material as a liquid which vaporizes into a gaseous form upon entry into the chamber.

17. The method of claim 13, wherein the step of introducing the hazardous waste material further comprises the step of:

supplying the hazardous waste material as a solid which sublimes into a gaseous form upon entry into the chamber.

* * * * *